United States Patent
Choi et al.

(10) Patent No.: US 6,903,513 B2
(45) Date of Patent: Jun. 7, 2005

(54) LIGHT EMITTING PANEL AND LIGHT EMITTING APPARATUS HAVING THE SAME

(75) Inventors: Beohm-Rock Choi, Seoul (KR); Joon-Hoo Choi, Seoul (KR); Jin-Koo Chung, Seoul (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 10/612,048

(22) Filed: Jul. 3, 2003

(65) Prior Publication Data
US 2004/0004444 A1 Jan. 8, 2004

(30) Foreign Application Priority Data
Jul. 5, 2002 (KR) .................. 10-2002-0038995

(51) Int. Cl.$^7$ .................................................. G09G 3/10
(52) U.S. Cl. ............................. 315/169.3; 315/169.2
(58) Field of Search ................. 315/169.3, 169.1, 315/169.2, 169.4; 345/36, 55; G09G 3/10

(56) References Cited

U.S. PATENT DOCUMENTS 6,380,688 B1 * 4/2002 Bae et al. ............. 315/169.3
6,380,689 B1 * 4/2002 Okuda .................. 315/169.3
6,617,800 B2 * 9/2003 Onozawa et al. ........ 315/169.3
2003/0001513 A1 * 1/2003 Onozawa et al. ........ 315/169.3

* cited by examiner

Primary Examiner—Trinh Vo Dinh
(74) Attorney, Agent, or Firm—McGuireWoods LLP

(57) ABSTRACT

An organic light-emitting panel includes a data line, a scan line, a voltage applying line, a switching device, an organic light emitting device and a driving device. The voltage applying line satisfies a condition expressed as $$\frac{i\partial V(\max)}{n} < A \frac{i\partial V data}{n} \text{ [Volt]},$$

GS wherein $\Delta V$max is a maximum voltage drop, 'n' is a number of pixels those are electrically connected to the voltage applying line, 'A' is a correction coefficient that is in a range from about 1 to about 2, $\Delta V$data is a voltage difference between the gray scales, and GS is a number of gray scale. According to the organic light-emitting panel, the voltage drop of the voltage applying line is reduced.

29 Claims, 11 Drawing Sheets

LIGHT EMITTING PANEL AND LIGHT EMITTING APPARATUS HAVING THE SAME

CROSS-REFERENCE TO RELATED APPLICATIONS

This application relies for priority upon Korean Patent Application No.2002-38995 filed on Jul. 5, 2002, the contents of which are herein incorporated by reference in its entirety.

BACKGROUND OF THE INVENTION

1. Field of the Invention

The present invention relates to a light emitting panel and a light emitting apparatus having the light emitting panel, and more particularly to a light emitting panel having reduced cross talk and a light emitting apparatus having the light emitting panel.

2. Description of the Related Art

Recently, a cathode ray tube (CRT) display device and a liquid crystal display device are widely used as display devices. The cathode ray tube has a heavy weight and a large size. The liquid crystal display device has a low luminance, a low light using efficiency and a narrow viewing angle. Thus, both of the cathode ray tube and the liquid crystal display devices are not satisfactory.

One of next display devices is a light emitting apparatus. The light emitting apparatus (or electro-luminescent display apparatus) has a high light efficiency, a thin thickness and a light weight. The light emitting apparatus includes an inorganic light emitting display device and an organic light emitting device.

The organic light-emitting device displays an image by electroluminescence of a specific organic matter (or a polymer), so that the organic light-emitting apparatus needs no back light assembly. Therefore, the organic light-emitting apparatus has a thin in thickness, a wide viewing angle and a high luminance.

FIG. 1 is an equivalent circuit diagram of a general organic light-emitting panel.

Referring to FIG. 1, a general organic light-emitting panel includes a switching transistor QS, a storage capacitor CST, a driver transistor QD and an organic light-emtting device OLED. A voltage applying line VDD is elongated in parallel with a data line. A plurality of pixels is electrically connected to the voltage applying line VDD. The number of pixels is equal to the number of the gate lines.

A luminance of the organic light-emitting apparatus is low in comparison with the cathode ray tube display device.

According to a method of driving, the organic light emitting apparatus classified into both active and passive matrix types.

A passive matrix organic light-emitting device is easily manufactured, and its driving method is very simple. However, the passive matrix organic light-emitting device consumes much power. Furthermore, an increasing in scan lines leads to complexity in the passive matrix driving method Therefore, an active matrix organic light-emitting device (AMOLED) is widely used. An amount of light emitted from an activation layer of the light-emitting cell is substantially proportional to a density of a current applied to the activation layer.

When an organic light-emitting panel is operated, a cross talk occurs along the voltage applying line VDD.

FIG. 2 is a schematic view showing a cross talk occurring on a general organic light-emitting panel.

The organic light-emitting panel of FIG. 2 corresponds to the organic light-emitting panel having the voltage applying line VDD in parallel with the data line.

Referring to FIG. 2, a column 'A' is a region corresponding to a dark color (or gray color). A column 'B' is a region corresponding to bright region (or white color).

An amount of a voltage drop of the column 'A' is small, but an amount of a voltage drop of the column 'B' is large due to the bright region R2. Therefore, a region R3 above (or below) the bright region R2 becomes darker than the region R1, although the region R3 is intended to have the same brightness as in the region R1.

As described above, pixels disposed near the white pixels are influenced by the white pixels. Therefore, as an area corresponding to white color increases, the luminance of the organic light-emitting panel decreases. Further, the brightness of the image is distorted along the voltage applying lines.

SUMMARY OF THE INVENTION

Accordingly, the present invention is provided to substantially obviate one or more problems due to limitations and disadvantages of the related art.

It is a feature of the present invention to provide first and second light emitting panels having a voltage applying line that reduces voltage drop.

In one aspect of the present invention, there is provided first and second light emitting apparatuses having the organic light-emitting panel.

The first light-emitting panel includes a data line, a scan line, a voltage applying line, a switching device, a light-emitting device and a driving device. In such manner that the data line transfers a data signal, the scan line transfers a scan signal, and the voltage applying line, which has first and second ends, applies potential difference. The first end is electrically connected to an external power supply. The switching device has first, second and third electrodes. The first electrode is electrically connected to the data line. The second electrode is electrically connected to the scan line. The third electrode outputs the data signal The light-emitting device has fourth and fifth electrodes. The fourth electrode is electrically connected to a reference voltage. An amount of a light generated from the light-emitting device relates to an amount of a density of a current applied to the light-emitting device. The driving g device has sixth, seventh and eight electrodes. The sixth electrode is electrically connect to the fifth electrode. The seventh electrode is electrically connected to the voltage applying line. The eighth electrode is electrically connected to the third line to receive the data signal. The voltage applying line satisfies a following condition $$\frac{\Delta V(\max)}{n} < A \frac{\frac{\Delta V data}{GS}}{n} [\text{Volt}],$$

wherein $\Delta V\max$ is a maximum voltage drop, 'n' is number of pixels at are electrically connected to the voltage applying line, 'A' is a correction coefficient that is in range from about 1 to about 4, $\Delta V data$ is a voltage difference between the gray scales, and GS is a number of gray scale.

The second light-emitting panel includes a data line, a scan line, a voltage applying line, a switching device, an light emitting device and a driving device. In which the data line transfers a data signal, wherein the scan line transfers a scan signal. The voltage applying line having first and second ends applies potential difference. The first end is electrically connected to an external power supply. The switching device has first, second and third electrodes. The first electrode is electrically connected to the data line, the second electrode is electrically connected to the scan line and the third electrode outputs the data signal. The light-emitting device has fourth and fifth electrodes. The fourth electrode is electrically connected to a reference voltage. An amount of a light generated from the light-emitting device relates to an amount of a density of a current applied to the light-emitting device. The driving device has sixth, seventh and eighth electrodes. The sixth electrode is electrically connected to the fifth electrode, and the seventh electrode is electrically connected to the voltage applying line. The eighth electrode is electrically connected to the third line to receive the data signal. The voltage applying line satisfies a following condition $$\frac{Lv}{P(\text{White})} < \frac{\left(A\frac{\Delta V data}{GS}\right) - 0.00001}{2300},$$

wherein Lv is a electrical resistance of the voltage applying line between the pixels, P(White) is a electrical resistance of the light-emitting device emitting white through, 'A' is a correction coefficient that is in a range from about 1 to about 4, $\Delta V$data is a voltage difference between the gray scales, GS is a number of gray scale, and 'n' is a number of pixels those are electrically connected to the voltage applying line.

The first light emitting apparatus includes a timing control part, a column driving part, a row driving part, a power supplying part and the first light emitting panel described as the above. The timing control part receives an image signal and a control signal of the image signal for first and second timing signals and a power control signal. The column driving part receives the image signal and the first timing signal for a data signal. The row driving part receives the second timing signal to get a scan signal. The power supplying part receives the power control signal to apply a voltage in accordance with the power control signal. The data line transfers a data signal. The first light-emitting panel includes a data line that transfers a data signal, a scan line that transfers a scan signal, a voltage applying line that applies PD(potential difference) having first and second ends, a switching device, an light emitting device and a driving device. The first end of the voltage applying line is electrically connected to an external power supply. The switching device has a first electrode that electrically connected to the data line, a second electrode that electrically connected to the scan line and a third electrode that outputs the data signal. The light-emitting device has fourth and fifth electrodes. The fourth electrode is electrically connected to a reference voltage. An amount of a light generated ft the light-emitting device relates to an amount of a density of a current applied to the light-emitting device. The driving device has sixth, seventh and eighth electrodes. When sixth electrode s electrically connected to the fifth electrode, the seventh electrode is electrically connected to the voltage applying line and the eighth electrode is electrically connected to the third line to receive the data signal. The voltage applying line satisfies a following condition $$\frac{i\partial V(\max)}{n} < A\frac{\frac{i\partial V data}{GS}}{n} \text{ [Volt]},$$

wherein $\Delta V$max is a maximum voltage drop, 'n' is a number of pixels which are electrically connected to the voltage applying line, 'A' is a correction coefficient that is in a range from about 1 to about 4, $\Delta V$data is a voltage difference between a gray scales, and GS is a number of gray scale.

The second light-emitting apparatus includes a timing control part, a column driving part, a row driving part, a power supplying part and the second light-emitting panel described above. The timing control part receives an image signal and a control signal of the image signal for output of first and second timing signals and a power control signal. The column driving part receives the image signal and the first timing signal to produce a data signal. The row driving part receives the second timing signal to produce a scan signal. The power supplying part receives the power control signal to apply a voltage in accordance with the power control signal. The second light-emitting panel includes a data line that transfers a data signal, scan line that transfers a scan signal, a voltage applying line that applies potential difference having first and second ends, a switching device, an light emitting device and a driving device. The first end of the voltage applying line is electrically connected to an external power supply. The switching device has first, second and third electrodes. The first electrode is electrically connected to the data line. The second electrode is electrically connected to the scan line. The third electrode outputs the data signal. The light-emitting device has fourth and fifth electrode. The fourth electrode is electrically connected to a reference voltage. An amount of a light generated from the light-emitting device relates to an amount of a density of a current applied t the light-emitting device. The driving device has sixth, seventh and eighth electrodes. The sixth electrode is electrically connected to the fifth electrode, the seventh electrode is electrically connected to the voltage applying line, the eighth electrode is electrically connected to the third line to receive the data signal. The voltage applying line satisfies a following condition $$\frac{Lv}{P(\text{White})} < \frac{\left(A\frac{\Delta V data}{GS}\right) - 0.00001}{2300},$$

wherein Lv is a electrical resistance of the voltage applying line between the pixels, P(White) is a electrical resistance of the light-emitting device emitting white light, 'A' is a correction coefficient that is in a range from about 1 to about 4, $\Delta V$data is a voltage difference between the gray scales, GS is a number of gray scale, and 'n' is a number those are electrically connected to the voltage applying line.

According to the first and second light-emitting panels, and the first and second light-emitting apparatuses, the voltage drop of the voltage applying line is reduced. Therefore, a cross talk decreases.

Further, the cross talk is more reduced by applying source voltage to both ends of the voltage applying line simultaneously.

BRIEF DESCRIPTION OF THE DRAWINGS

The above and other features and advantages of the present invention will become more apparent by describing in detail the preferred embodiments thereof with reference to the accompanying diagrams, in which.

DESCRIPTION OF INVENTION

Hereinafter the preferred embodiment of the present invention will be described in detail with reference to the accompanying diagrams.

Figure 3:
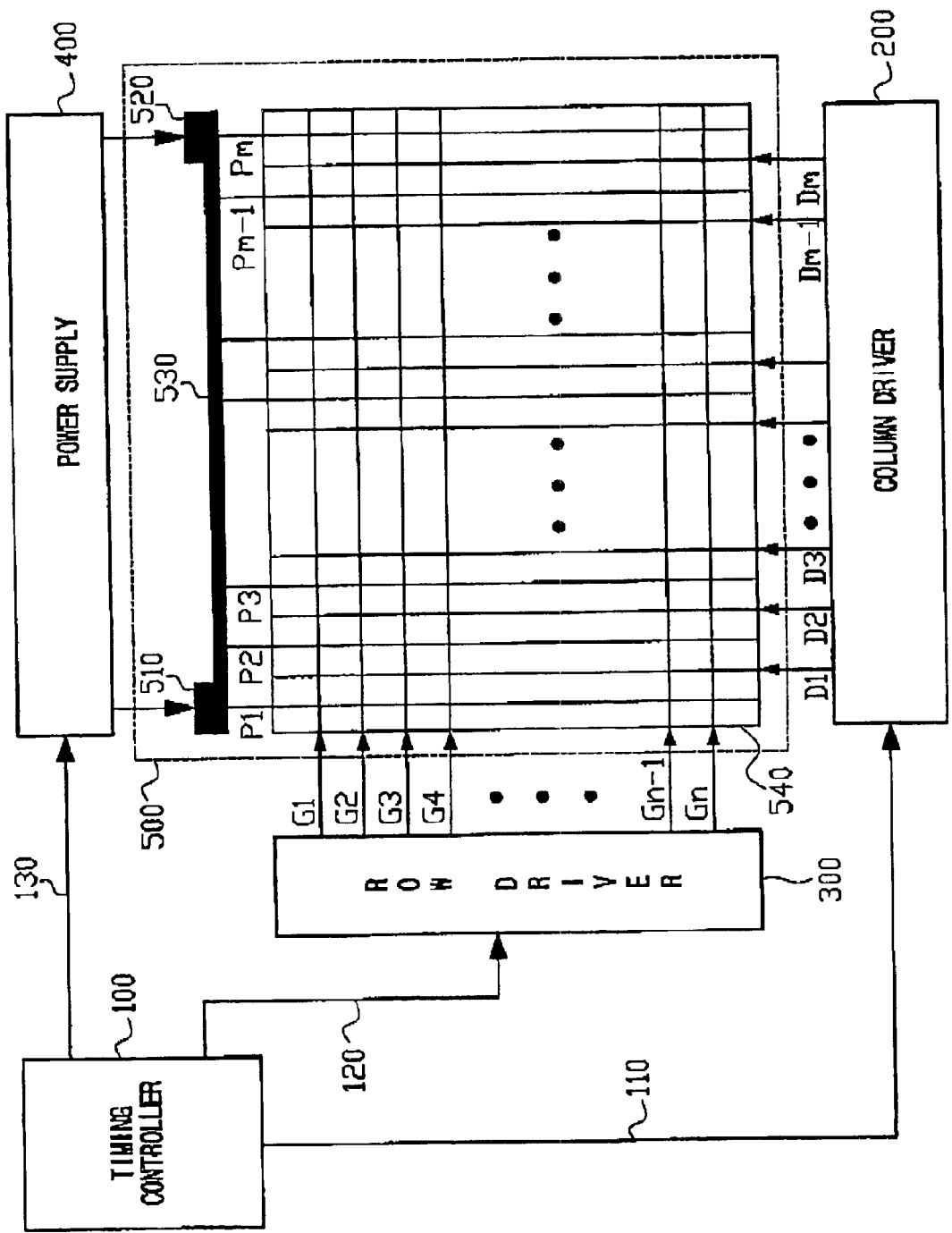
FIG. 3 is a block diagram showing an organic light emitting apparatus according to a first exemplary embodiment of the present invention.

FIG. 3 is a block diagram showing an organic light-emitting apparatus according to a first exemplary embodiment of the present invention.

Referring to FIG. 3, an organic light-emitting apparatus according to a first exemplary embodiment of the present invention includes a timing controller (or a timing control part) 100, a column driver (or a column driving part) 200, a row driver (or a row driving part) 300, a power supply (or a power supplying part) 400 and an organic light-emitting panel 500.

The timing controller 100 receives an external image signal and a control signal of the image signal from an external device such as a graphic controller (not shown) to generate first and second timing signals of 110 and 120. The first timing signal 110 is transferred to the column driver 200. The second timing signal 120 is transferred to the row driver 300. The timing controller 100 outputs a power control signal 130 to provide the power supply 400 with the power control signal 130.

The column driver 200 receives the image signal and the first timing control signal from the timing controller 100 to provide the organic light emitting panel 500 with data signals.

The row driver 300 receives the second timing signal 120 from the timing controller 100 to provide the organic light-emitting panel 500 with a scan signals (or gate signals).

The power supply 400 receives the power control signal 130 from the timing controller 100 to provide voltage applying lines P1, P2, ..., Pm--1, Pm of the organic light-emitting panel 500 with powers respectively.

The organic light-emitting panel 500 includes a first station 510, a second station 520 and a bridge line 530. The bridge line 530 is connected between the first station 510 and the second station 520. The organic light emitting panel 500 includes m-number of data lines, m-number of voltage applying lines, n-number of scan lines, a switching transistor QS, a driver transistor QD, an organic light-emitting device OLED and a storage capacitor CST. The data signals are transferred via the data lines D1, D2, ..., Dm-1, Dm. A source voltage is transferred via the voltage applying lines P1, P2, ..., Pm-1, Pm. The scan signals are transferred via the scan lines G1, G2, ..., Gn-1, Gn.

The organic light-emitting apparatus displays an image of the data signals provided from the column driver 200 according to the scan signals provided from the row driver 300.

The switching transistor QS includes a first electrode, a second electrode and a third electrode. The first electrode is electrically connected to the data line. The second electrode is electrically connected to the scan line, so that the switching transistor is turned on/off according to the scan signal provided from the scan line. The data signal is outputted through the third electrode.

The organic light-emitting device OLED includes a fourth electrode and a fifth electrode. The fourth electrode is electrically connected to a reference voltage. An amount of a light generated from the organic light emitting device OLED relates to a density of a current applied to the organic light-emitting device OLED. That is, when the density of the current is large, the organic light-emitting device OLED generates a large amount of light.

The driving transistor QD includes a sixth electrode, a seventh electrode and an eighth electrode. The sixth electrode is electrically connected to the fifth electrode of the organic light emitting device OLED. The seventh electrode is electrically connected to the voltage applying line. The eighth electrode is electrically connected to the third electrode of the switching transistor QS, so that the eighth electrode is turned on/off according to the data signal provided from the data line via the switching transistor QS. Therefore, the driver transparent QD controls the organic light-emitting device OLED.

The storage capacitor CST includes a ninth electrode and a tenth electrode. The ninth electrode is electrically connected to the eighth electrode of the driver transistor QD. The tenth electrode is electrically connected to the voltage applying line, so that the storage capacitor CST stores a source voltage provided from the voltage applying line.

The source voltage provided from the power supply 400 is applied to the first station 510 and the second station 520 to be transferred to the bridge line 530. Therefore, the source voltage is distributed to the voltage applying lines. Although, only two stations 510 and 520 are disclosed in FIG. 3, more than two stations may be equipped so as to provide the voltage applying line with uniform power.

Hereinafter, a factor of the cross talk is explained.

According to a gray scale of a pixel, a magnitude of a voltage of the voltage applying line that is electrically connected to the pixel is determined. For example, when the pixel displays a white color, a high voltage is applied to the voltage applying line that is electrically connected to the pixel.

Figure 1:
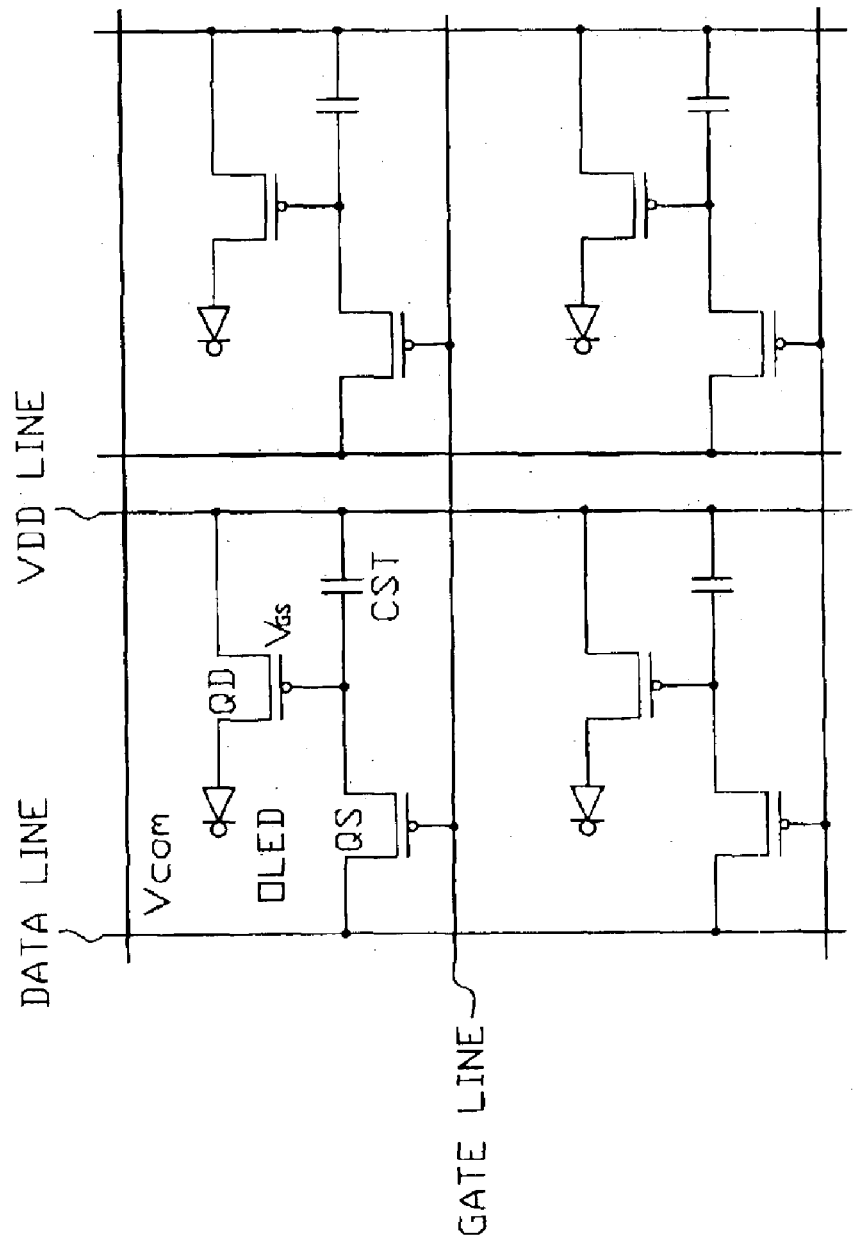
FIG. 1 is an equivalent circuit diagram of a general organic light-emitting panel.
Figure 2:
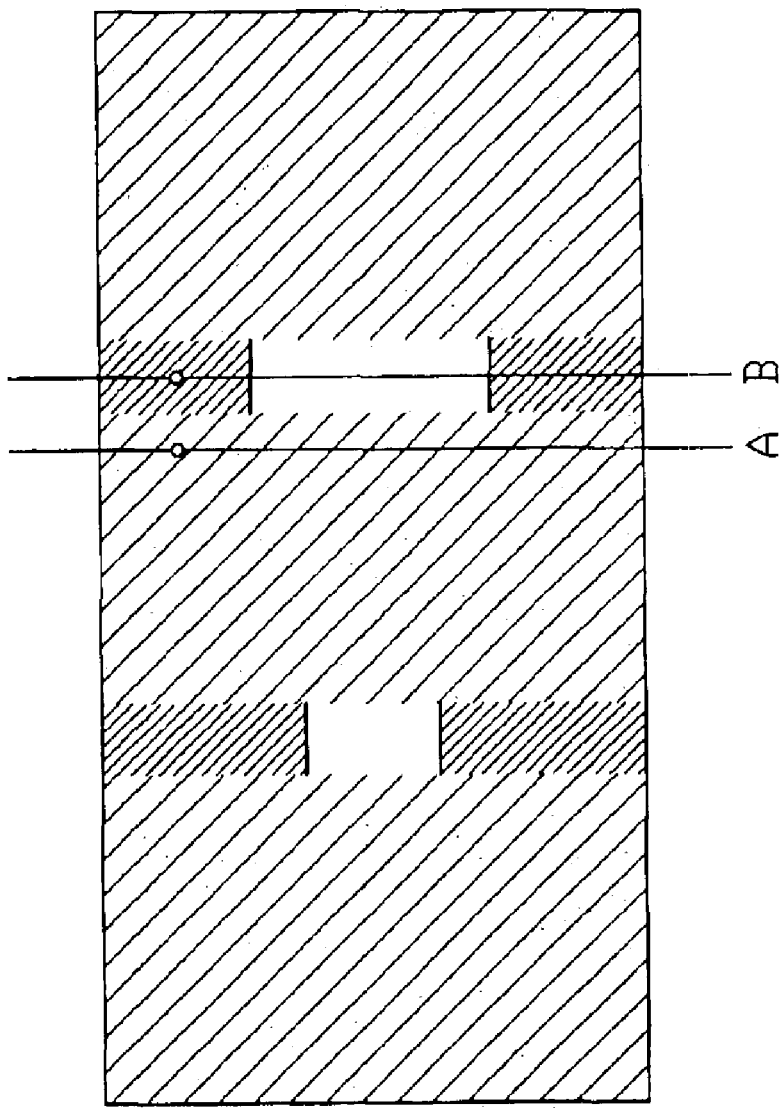
FIG. 2 is a schematic view showing a cross talk occurring on a general organic light-emitting panel.

Referring again to FIG. 1, according to a voltage difference Vgs between the eighth electrode (or gate electrode) and the seventh electrode (source electrode) that is electrically connected to a voltage applying line, a gray scale of a pixel corresponding to the voltage applying line is determined. Therefore, when a voltage applied to the voltage applying line is dropped, so that the voltage becomes lower than an intended voltage, the pixel corresponding to the voltage applying line becomes dark. That is, the farther the pixel is spaced apart from the bridge line 530, the darker the pixel is.

Figure 4:
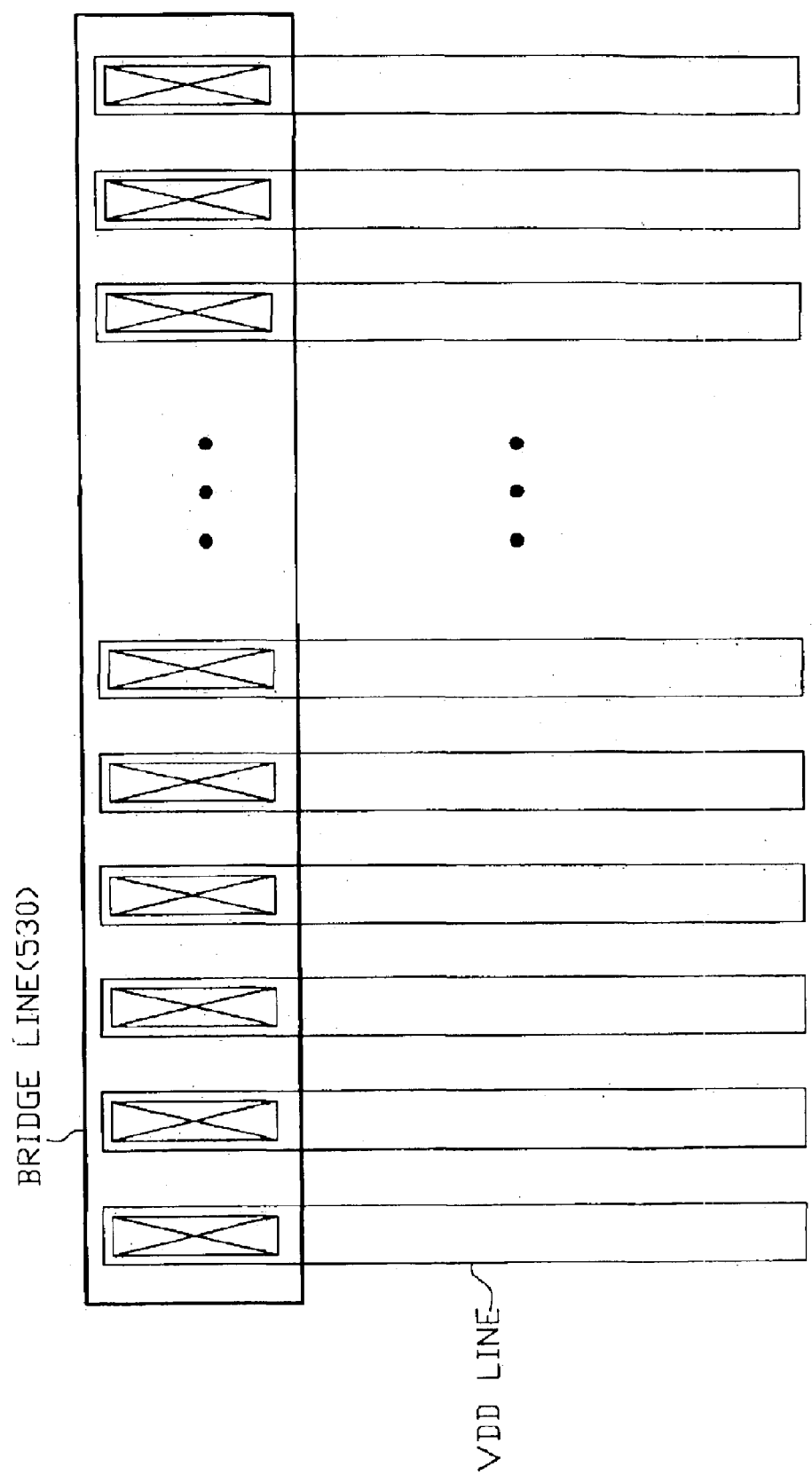
FIG. 4 is a schematic view showing a portion of a voltage applying line of FIG. 3.

FIG. 4 is a schematic view showing a portion of a voltage applying line of FIG. 3.

Referring to FIGS. 3 and 4, a voltage applying line VDD is elongated in a direction that is perpendicular to the bridge line 530.

The bridge line 530 connects the first station 510 to the second station 520.

A plurality of the voltage applying lines VDD is electrically connected to the bridge line 530 via a contact hole. A number of the voltage applying line is determined according to a resolution. The bridge line 530 comprises an aluminum-neodymium (AlNd). A thickness of the bridge line 530 is about 3000 Å. The bridge line 530 is formed simultaneously with the scan line (or gate line). The voltage applying line VDD comprises molybdenum tungsten (MoW). A thickness of the voltage applying line VDD is about 3000 Å.

Herein after, the voltage drop occurring in the voltage applying line VDD is explained in detail with reference to FIG. 5.

Figure 5:
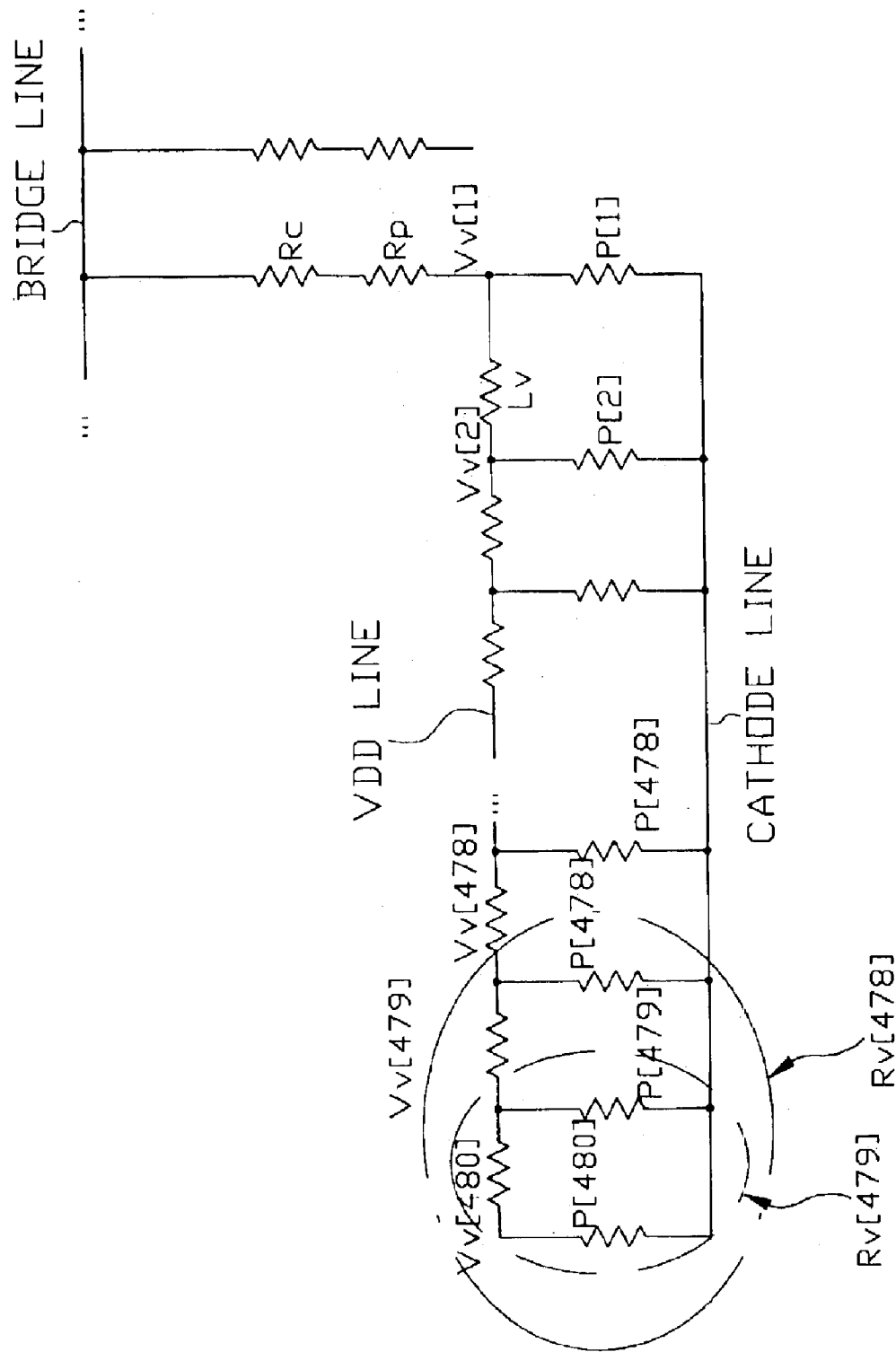
FIG. 5 is a schematic view showing a resistance of a voltage applying line of FIG. 3.

FIG. 5 is a schematic view showing a resistance of a voltage applying line of FIG. 3.

In FIG. 5, a resistance of the voltage applying line of a video graphic array (VGA) organic light-emitting panel of which resolution is 640×480×3 is shown. A cathode resistance is neglected.

Referring to FIGS. 4 and 5, four hundred eighty pixels are electrically connected in parallel to one voltage applying line VDD. A resistance Lv in the voltage applying line VDD exists between the pixels.

In FIG. 5, 'Rc' denotes an electrical resistance of a contact hole that connects the voltage applying line VDD to the bridge line 530. 'Rp' denotes an electrical resistance of a fan out line of the voltage applying line VDD. 'Lv' denotes an electrical resistance of the voltage applying line VDD between an n-th pixel and (n−1)-th pixel. 'Vv[n]' denotes a voltage of the voltage applying line VDD applied to the n-th pixel. 'Rv[n]' denotes an equivalent electrical resistance from the n-th pixel to a last pixel (for example 480th pixel). 'P[n]' denotes an electrical resistance of the n-th pixel (or sum of a resistance of the driver transistor QD and a resistance of the organic light emitting device OLED).

For example, values of the 'Rc', 'Rp', 'Lv', 'P[in]' and VDD are to be as shown in table 1.

TABLE 1

| Rc | 0.00214[Ω] | AlNd$_{(Gate)}$/MoW$_{(Data)}$ |
|---|---|---|
| Rp | 55[Ω] | MoW (A thickness is 3000 Å and a width is 7 μm) |
| Lv | 11.0[Ω] | A pitch of pixel (A distance between the pixels) is 200 μm |
| P[n] | 22.5[Ω] | |
| VDD | 10[Volts] | |

An equivalent electrical resistance of $479^{th}$ pixel Rv[479] is represented in a following Expression 1.

$$\frac{1}{Rv[479]} = \frac{1}{Lv + P[480]} + \frac{1}{P[479]}.$$ Expression 1

When Expression 1 is generalized, Expression 1 may be represented in a following Expression 2.

$$\frac{1}{Rv[n]} = \frac{1}{Lv + Rv[n+1]} + \frac{1}{P[n]},$$ Expression 2 wherein Rv[n] is an equivalent electrical resistance from n-th pixel to a last pixel, Lv is an electrical resistance of the voltage applying line VDD between an n-th pixel and (n−1)-th pixel, and P[n] is an electrical resistance of the n-th pixel (or sum of a resistance of the driver transistor QD and a resistance of the organic light-emitting device OLED).

A voltage of a first pixel Vv[1] is represented as a following Expression 3.

$$Vv[1] = Rv[1]\frac{VDD}{Rc + Rp + Rv[1]}.$$ Expression 3

When Expression 3 is generalized, Expression 1 may be represented in a following Expression 4.

$$Vv[n] = Rv[n]\left(\frac{Vv[n-1]}{Lv + Rv[n]}\right),$$ Expression 4 wherein Vv[n] is a voltage of the voltage applying line VDD applied to the n-th pixel, Rv[n] is an equivalent electrical resistance from n-th pixel to a last pixel, and Lv is an electrical resistance of the voltage applying line VDD between an n-th pixel and (n−1)-th pixel.

Figure 6:
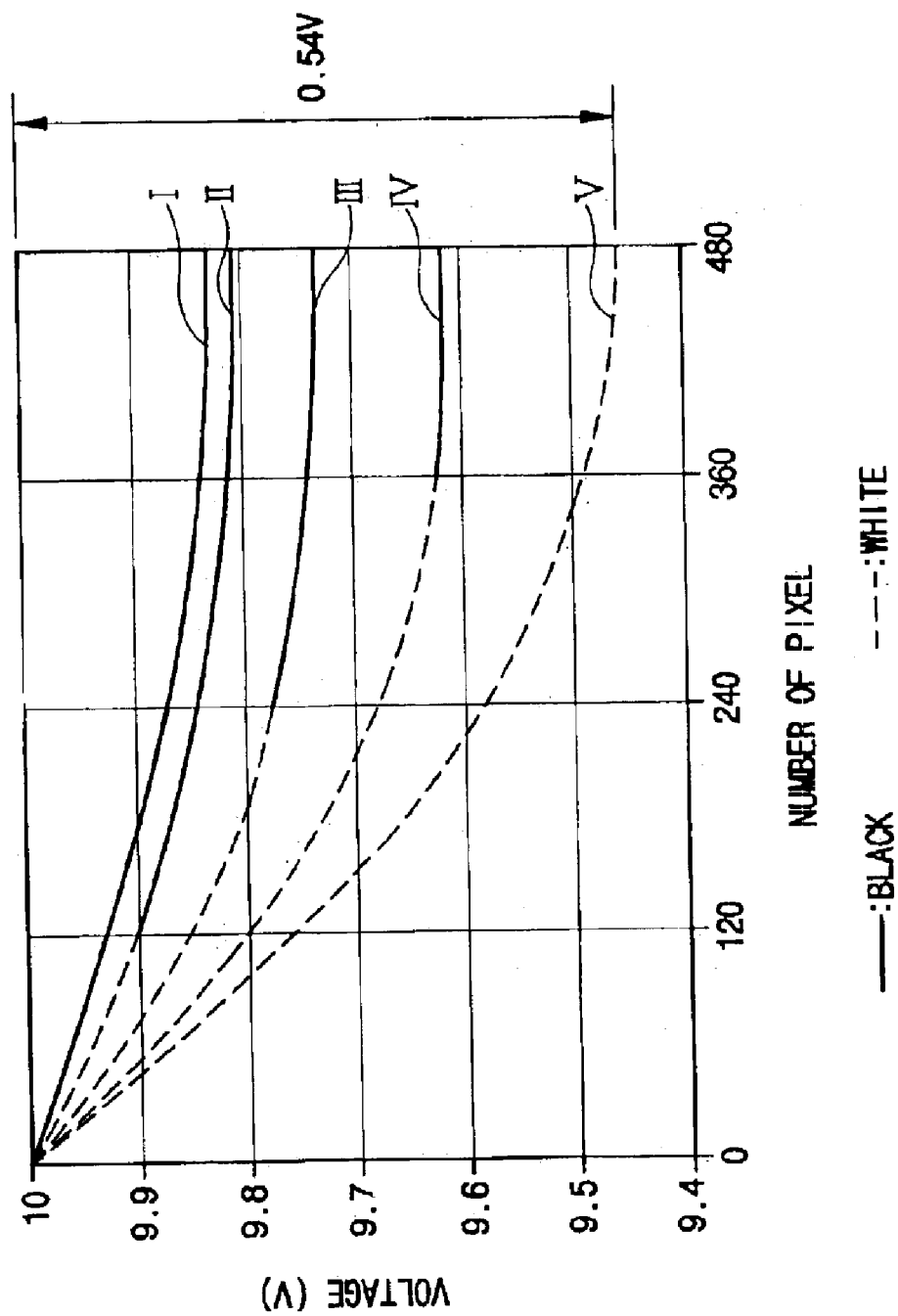
FIG. 6 is a graph showing a voltage drop in case that a voltage applying line comprises a molybdenum tungsten (MoW) layer of which a thickness is 3,000 Å.

FIG. 6 is a graph showing a voltage drop in case that a voltage applying line comprises a molybdenum tungsten (MoW) layer of which a thickness is 3,000 Å.

A video graphic array (VGA) organic light-emitting panel of which resolution is 640×480×3 used for an experiment. The voltage applying line VDD of the light-emitting panel is in parallel to the scan line (or data line). The voltage applying line VDD includes a molybdenum tungsten (MoW) layer of which a thickness is 3,000 Å.

A waveform I corresponds to a voltage drop in case that all pixels are black. A waveform II corresponds to a voltage drop, when 1st to $120^{th}$ pixels correspond to a white color, and $121^{st}$ to $480^{th}$ pixels correspond to black color. A waveform III corresponds to a voltage drop, when 1st to $240^{th}$ pixels correspond to a white color, and $241^{st}$ to $480^{th}$ pixels correspond to a black color. A waveform IV corresponds to a voltage drop, when 1st to $360^{th}$ pixels correspond to a white color, and $361^{st}$ to $480^{th}$ pixels correspond to a black color. A waveform V corresponds to a voltage drop, when all pixels correspond to a white color.

As shown in FIG. 6, according to the increasing a pixel corresponding to a white color, an amount of the voltage drop increases. The farther the pixels are spaced apart from the bridge line, the larger the amount of the voltage drop. The more the pixels are, the larger the amount of the voltage drops.

Specially, when all pixels correspond to a white color as shown in the waveform V, the amount of the voltage drops extends to 0.54V.

FIG. 6 corresponds to the organic light-emitting panel having the voltage applying line that is in parallel to the data line. However, in an organic light-emitting panel having the voltage applying line that is in parallel to the scan line, the voltage drop occurs also.

As shown in FIG. 6, when the voltage drop occurs, the organic light-emitting panel displays a non-uniform image. Further, according to a gray scale of the pixels arranged in a column direction and a row direction, a voltage distribution varies. Therefore, the luminance of the organic light-emitting panel changes.

In the organic light-emitting panel, the gray scale is determined by a voltage difference between the voltage applying line VDD and the data signal. In other word, the gray scale is determined by a voltage difference Vgs between the eighth electrode (or gate electrode) and the seventh electrode (or source electrode) of the driver transistor QD.

When the voltage drop occurs along the voltage applying line VDD, the voltage difference Vgs of the pixels electrically connected to the voltage applying line VDD changes. Therefore, the organic light-emitting panel displays a non-uniform image.

In an organic light-emitting panel having the voltage applying line that is in parallel with the scan line, the voltage difference Vgs changes, too.

Hereinafter, an organic light-emitting panel having reduced voltage drop is explained.

A following Expression 5 may be induced from Expression 4.

$$\frac{Vv[n-1]}{Vv[n]} = 1 + \frac{Lv}{Rv[n]}. \quad \text{Expression 5}$$

In Expression 5, when a ratio of Lv to Rv[n] approaches 0, a ratio of Vv[n−1] to Vv[n] approaches 1. Therefore, when Lv is small with respect to Rv[n], the organic light-emitting panel displays uniform images.

The ratio of Lv to Rv[n] may be induced from Expression 2, as shown in a following Expression 6.

$$\frac{Lv}{Rv[n]} = \frac{1}{\frac{Rv[n+1]}{Lv} + 1} + \frac{Lv}{P[n]} \quad \text{Expression 6}$$

Referring to Expression 6, when the electrical resistance Lv of the voltage applying line VDD between an n-th pixel and (n−1)-th pixel becomes smaller and an electrical resistance P[n] of the n-th pixel (or sum of a resistance of the driver transistor QD and a resistance of the organic light emitting device OLED) becomes large, the organic light-emitting panel displays a uniform image.

Therefore, when the voltage applying line VDD comprises a metal that has a low resistivity, and when a thickness of the voltage applying line increases, the electrical resistance Lv decreases.

When the electrical resistance P[n] is large, a small amount of current flows through the pixel under a fixed voltage. Therefore, in order to maintain the luminance of the organic light-emitting panel, the organic light-emitting device OLED having the enhanced efficiency should be used.

Hereinafter, a condition for reducing the cross talk is explained.

The gray scale is determined by a voltage difference Vgs between the eighth electrode (or gate electrode) and the seventh electrode (or source electrode) of the driver transistor QD. When the voltage drop occurs along the voltage applying line VDD, the voltage difference Vgs is changed, so that the pixels electrically connected to the voltage applying line VDD displays dark image.

When a flowing Expression 7 is satisfied, the cross talk is reduced.

$$\Delta V\max < \frac{\Delta V data}{GS}, \quad \text{Expression 7}$$

wherein ΔVmax denotes a maximum voltage drop, ΔVdata denotes a voltage difference between the gray scales, and GS denotes a number of gray scale.

When the maximum voltage drop ΔVmax is smaller than the voltage difference ΔVdata per unit gray scale, the cross talk is reduced.

The voltage difference ΔVdata is a difference in the voltage (for example 0V) corresponding to a white color and the voltage (for example 5V) corresponding to a black color.

For example, when the data voltage is in a range from about 0V to about 5V and a number of the gray scale is 64, a voltage difference of each gray scale is about 0.078 V (or 5/64V).

When all pixels connected to the voltage applying line VDD correspond to a white color, the amount of voltage drop is maximized. Therefore, when the voltage drop of the voltage applying line VDD is less than 0.078V, the cross talk is eliminated.

Meanwhile, the maximum voltage drop ΔVmax is a function of a ratio of Lv to P(white), where Lv is an electrical resistance of the voltage applying line VDD between an n-th pixel and (n−1)-th pixel, and P(white) is an electrical resistance of the pixel corresponding to a white color (or sum of a resistance of the driver transistor QD and a resistance of the organic light emitting device OLED emitting white light).

Figure 7:
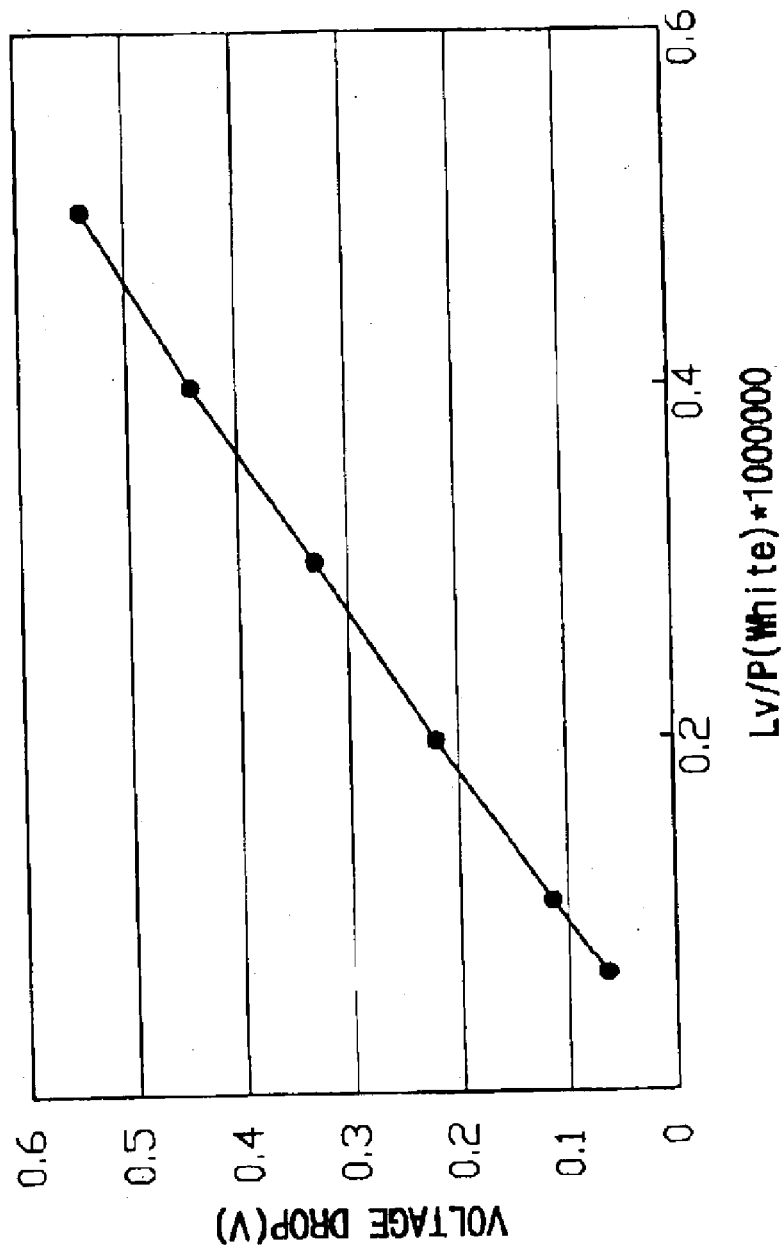
FIG. 7 is a graph showing a relation between a voltage drop and a ratio of Lv to P(white)

FIG. 7 is a graph showing a relation between a voltage drop and a ratio of Lv to P(white).

FIG. 7 corresponds to a 7-inch wide video graphic array (WVGA) panel.

Referring to FIG. 7, the voltage drop is substantially directly proportional to a ratio of Lv to P(white).

Based on the above relation of the voltage drop and the ratio of Lv to P(white), a condition for preventing the cross talk of the voltage applying line is induced.

In order to induce the condition for preventing the cross talk regardless of the resolution of the organic light emitting panel, the maximum voltage drop per number of pixels that are electrically connected to the voltage applying line (or ΔVmax/n) is introduced.

Figure 8:
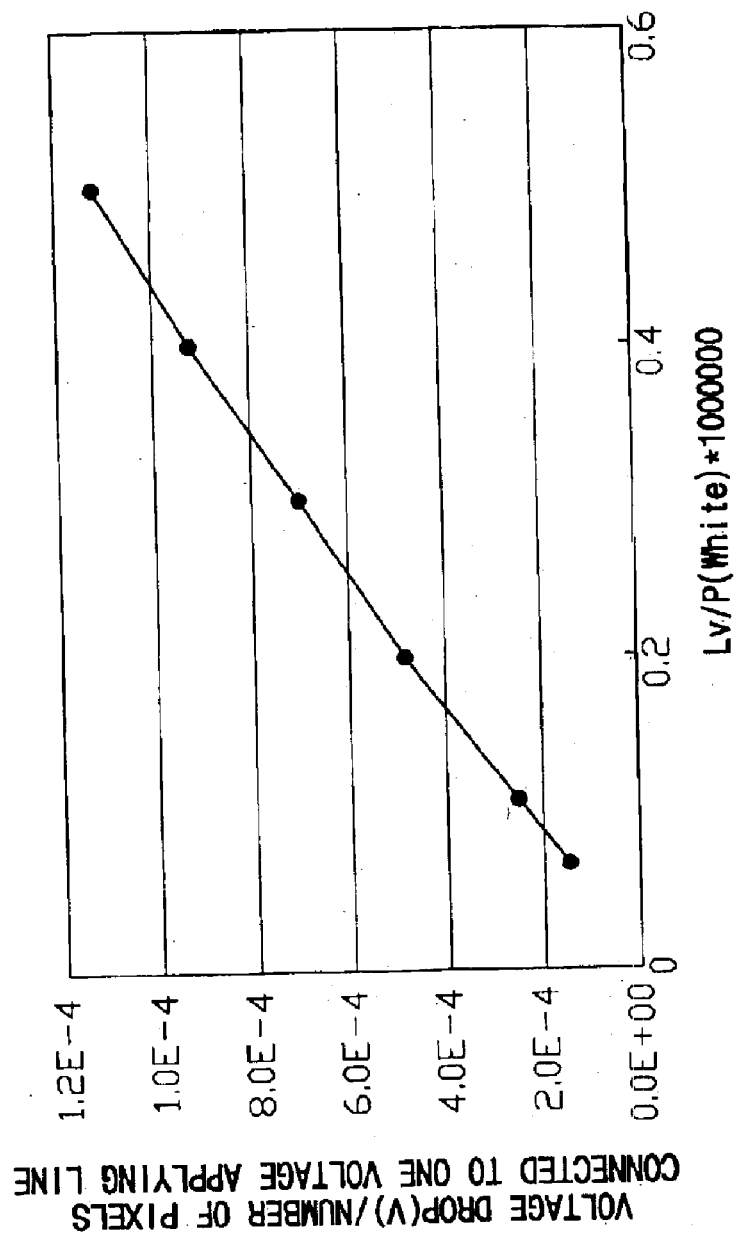
FIG. 8 is a graph showing a relation between a voltage drop per pixel and a ratio as Lv to P(white)

FIG. 8 is a graph showing a relation between a voltage drop per pixel and a ratio of Lv to P(white).

Referring to FIG. 8, the maximum voltage drop per the number of pixels that are electrically connected to the voltage applying line is directly proportional to the ratio of Lv to P(white) per the number of pixels.

$$\frac{\Delta V(\max)}{n} < A \frac{\frac{\Delta V data}{GS}}{n} [\text{Volt}], \quad \text{Expression 8}$$

wherein ΔVmax denotes a maximum voltage drop, 'n' is a number of pixels those are electrically connected to the voltage applying line, 'A' is a correction coefficient that is in a range from about 1 to about 2, ΔVdata denotes a voltage difference between the gray scales, and GS denotes a number of gray scale.

From FIG. 8, a relation between ΔVmax/n and Lv/P (white) is expressed as the following Expression 9.

$$\frac{\Delta V(\max)}{n} = 2300 \frac{Lv}{P(\text{white})} + 0.00001. \qquad \text{Expression 9}$$

Therefore, from Expressions 8 and 9, an allowable range of Lv/P(while) is expressed as following Expression 10.

$$\frac{Lv}{P(\text{White})} < \frac{\left(A \frac{\Delta V data}{GS}\right) - 0.00001}{2300}, \qquad \text{Expression 10}$$

wherein Lv is a electrical resistance of the voltage applying line between the pixels, P(White) is a electrical resistance of the organic light emitting device emitting white light, 'A' is a correction coefficient that is in a range from about 1 to about 4, ΔVdata is a voltage difference between the gray scales, GS is a number of gray scale, and 'n' is a number of pixels that are electrically connected to the voltage applying line.

When the Expression 10 of the video graphic array (VGA) organic light-emitting panel is calculated, Expression 10 is expressed as a following Expression 11.

$$\frac{Lv}{P(\text{White})} < \frac{A\left(\frac{0.078}{480}\right) - 0.00001}{2300} = 66,300 \times A. \qquad \text{Expression 11}$$

In order to reduce the voltage drop, aluminum-neodymium (AlNd) may be used for the voltage applying line, such that a thickness of the aluminum-neodymium (AlNd) is 3,000 §. The result of experiment is shown in FIG. 9.

Figure 9:
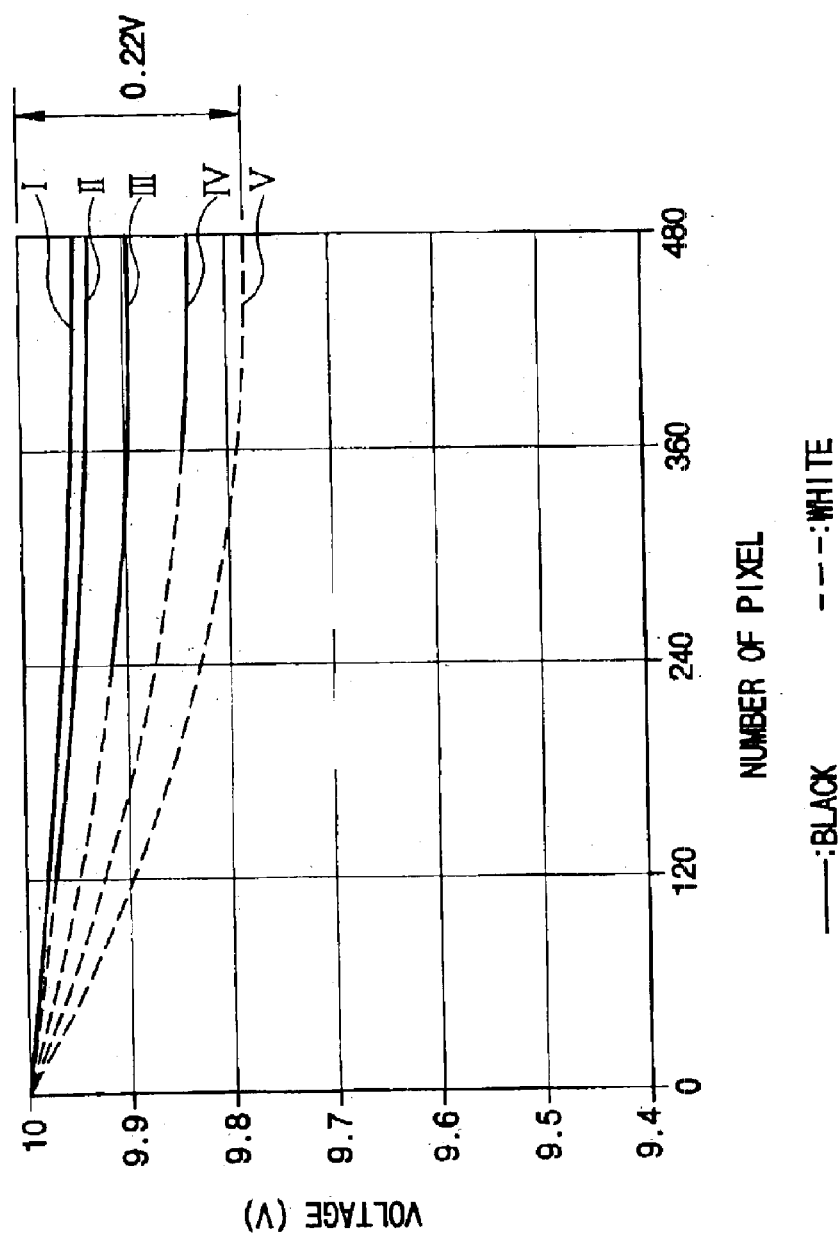
FIG. 9 is a graph showing a voltage drop in case that a voltage applying line comprises a first layer comprising an aluminum-neodymium (AlNd) of which a thickness is 3,000 Å, and a second layer comprising a molybdenum-tungsten (MoW) of which a thickness is 500 Å.

FIG. 9 is a graph showing a voltage drop in case that a voltage applying line comprises a first layer comprising an aluminum-neodymium (AlNd) of which a thickness is 3,000 Å, and a second layer comprising a molybdenum-tungsten (MoW) of which a thickness is 500 Å.

A video graphic array (VGA) organic light-emitting panel of which resolution is 640×480×3 is used for an experiment. The voltage applying line VDD of the light-emitting panel is in parallel to the scan line (or data line). The voltage applying line VDD is a double-layered structure including a first layer and a second layer. The first layer comprises an aluminum-neodymium (AlNd) of which a thickness is 3,000 Å. The second layer comprises a molybdenum-tungsten (MoW) of which a thickness is 500 Å.

A Waveform I corresponds to a voltage drop in case that all pixels are black. A waveform II corresponds to a voltage drop, when 1st to $120^{th}$ pixels correspond to a white color, and $121^{st}$ to $480^{th}$ pixels correspond to black color. A waveform III corresponds to a voltage drop, when 1st to $240^{th}$ pixels correspond to a white color, and $24^{st}$ to $480^{th}$ pixels correspond to a black color. A waveform IV corresponds to a voltage drop, when 1st to $360^{th}$ pixels correspond to a white color, and $361^{st}$ to $480^{th}$ pixels correspond to a black color. A waveform V corresponds to a voltage drop, when all pixels correspond to a white color.

Referring to FIG. 9, a voltage drop of the voltage applying line is about 0.22V, when all pixels correspond to a white color.

In order to reduce the voltage drop more, aluminum-neodymium (AlNd) may be used for the voltage applying line, such that a thickness of the aluminum-neodymium (AlNd) is 6,000 Å.

Figure 10:
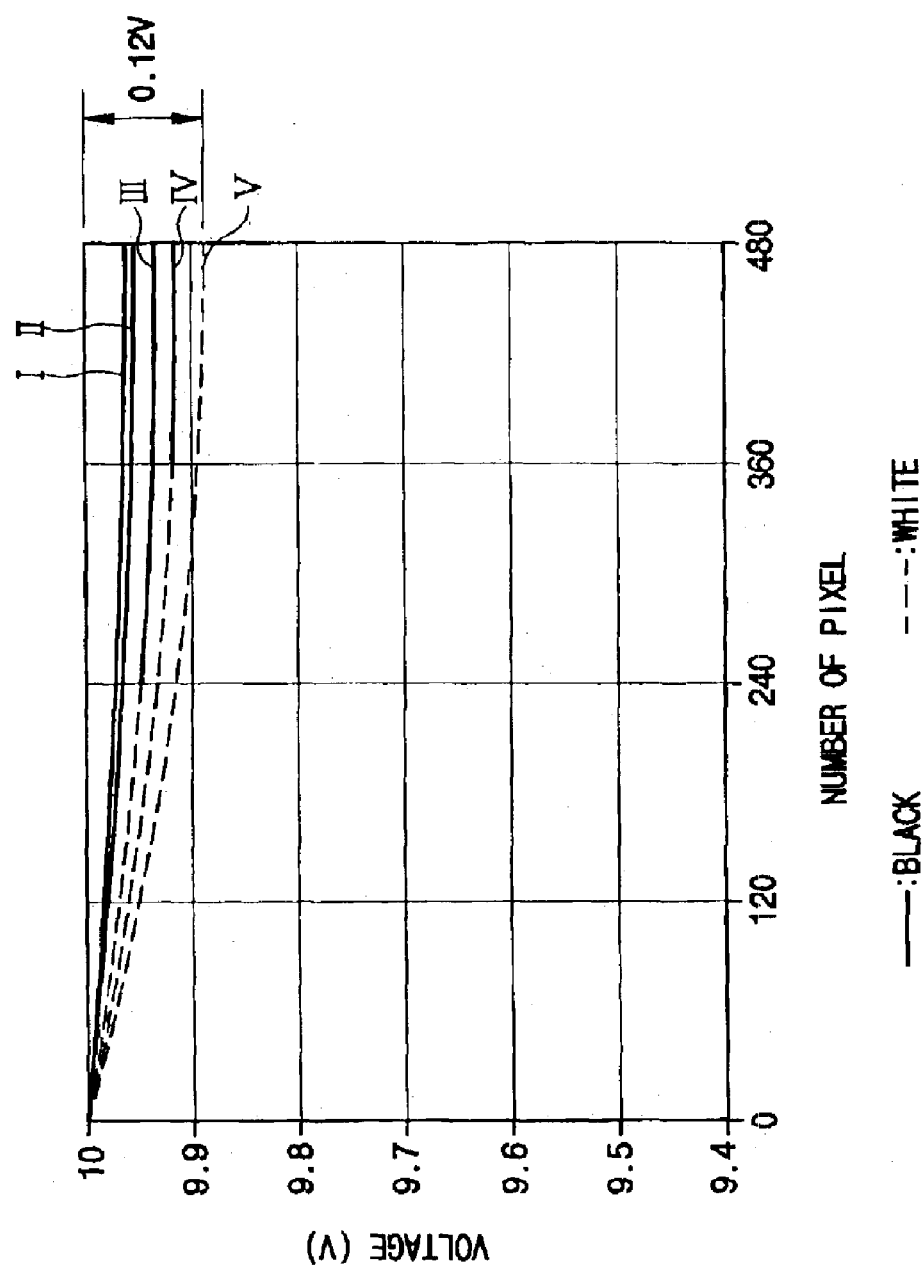
FIG. 10 is a graph showing a voltage drop in a case that a voltage applying line comprises a first layer comprising an aluminum-neodymium (AlNd) of which a thickness is 6,000 Å, and a second layer comprising a molybdenum-tungsten (MoW) of which a thickness is 500 Å.

FIG. 10 is a graph showing a voltage drop in case that a voltage applying line comprises a first layer comprising an aluminum-neodymium (AlNd) of which a thickness is 6,000 Å, and a second layer comprising a molybdenum-tungsten (MoW) of which a thickness is 500 Å.

A video graphic array (VGA) organic light-emitting panel of which resolution is 640×480×3 is used for an experiment. The voltage applying line VDD of the light-emitting panel is in parallel to the scan line (or data line). The voltage applying line VDD is a double-layered structure including a first layer and a second layer. The first layer comprises an aluminum-neodymium (AlNd) of which a thickness is 6,000 Å. The second layer comprises a molybdenum tungsten (MoW) of which a thickness is 500 Å.

A waveform I corresponds to a voltage drop in case that all pixels are black. A waveform II corresponds to a voltage drop, when 1st to $120^{th}$ pixels correspond to a white color, and $121^{st}$ to $480^{th}$ pixels correspond to black color. A waveform III corresponds to a voltage drop, when 1st to $240^{th}$ pixels correspond to a white color, and $241^{st}$ to $480^{th}$ pixels correspond to a black color. A waveform IV corresponds to a voltage drop, when 1st to $360^{th}$ pixels correspond to a white color, and $361^{st}$ to $480^{th}$ pixels correspond to a black color. A waveform V corresponds to a voltage drop, when all pixels correspond to a white color.

Referring to FIG. 10, a voltage drop of the voltage applying line is about 0.12V, when all pixels correspond to a white color.

As described above, when the resistance of the voltage applying line VDD decreases, the amount of voltage drop decreases. Especially, when the amount of voltage drop is less than voltage difference between the gray scales, the cross talk between the pixels those are connected to one voltage applying line decreases.

Figure 11:
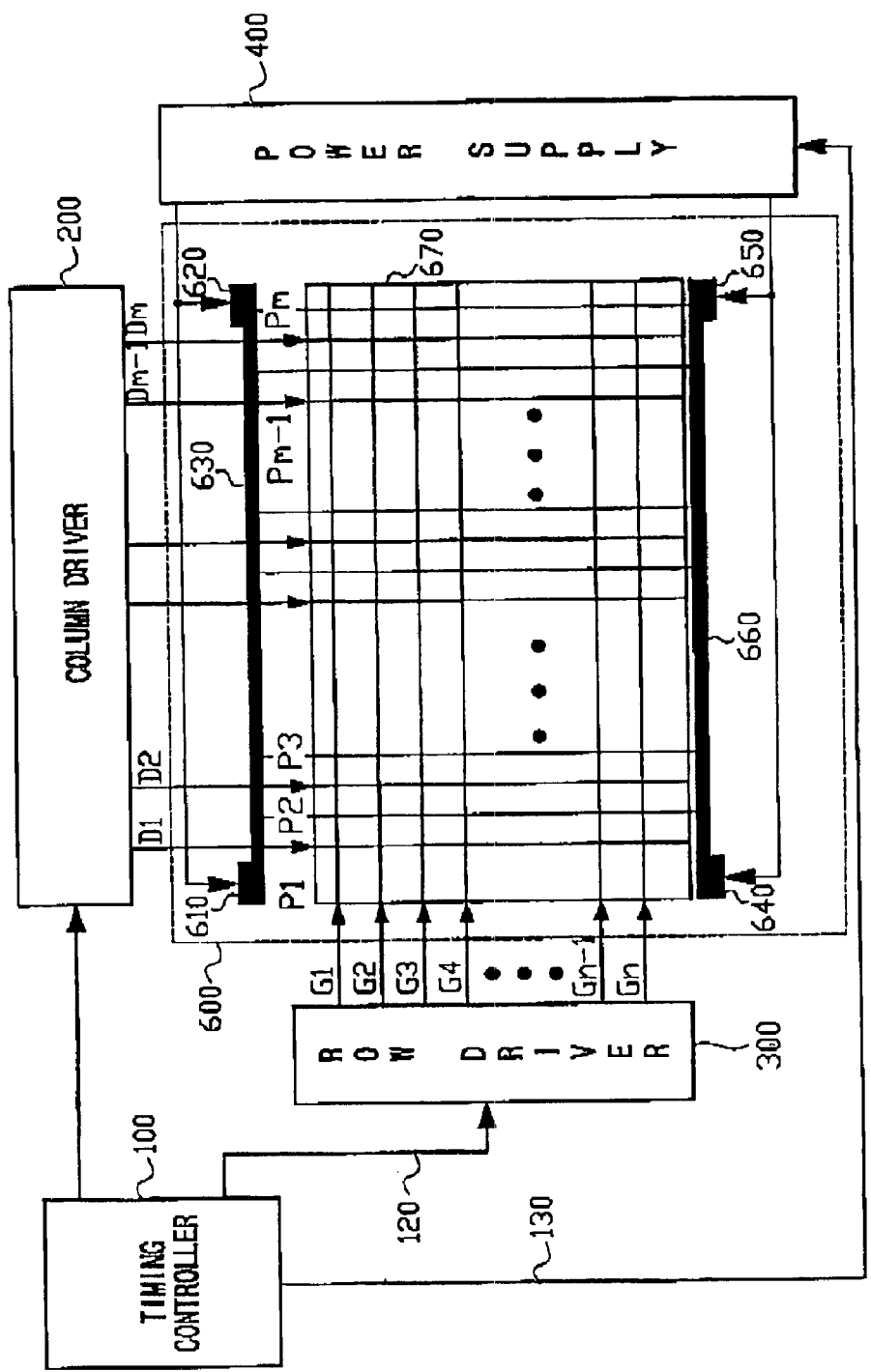
FIG. 11 is a block diagram showing an organic light-emitting apparatus according to a second exemplary embodiment of the present invention.

In order to reduce the voltage drop, both end of the voltage applying line may be connected to the power supply as shown in FIG. 11.

FIG. 11 is a block diagram showing an organic light-emitting apparatus according to a second exemplary embodiment of the present invention.

Referring to FIG. 11, an organic light emitting apparatus according to a second exemplary embodiment of the present invention includes a timing controller 100, a column driver 200, a row driver 300, a power supply 400 and an organic light-emitting panel 600. In FIG. 11, the same reference numerals denote the same elements as in FIG. 3, and thus the detailed descriptions of the same elements will be omitted.

The power supply 400 receives the power control signal 130 to provide a voltage applying line with power via both ends of the voltage applying line.

The organic light-emitting panel 600 includes a first station 610, a second station 620, a third station 640, a fourth station 650, a first bridge line 630 and a second bridge line 660. The first bridge line 630 is electrically connected to the first station 610 and the second station 620. The second bridge line 660 is electrically connected to the third station 640 and the fourth station 650.

The organic light emitting panel 600 also includes m-number of data lines, m-number of voltage applying lines, n-number of scan lines, a switching transistor QS, a driver transistor QD, an organic light emitting device OLED and a storage capacitor CST. A data signal is transferred via the data lines. The voltage applying lines transfers power provided from the first bridge line 630 and the second bridge line 660. A scan signal is transferred via the scan line. An image is displayed via the organic light-emitting panel. As described above, the voltage applying line has low resistance, so that the-voltage drop is minimized.

When the power is provided to the voltage applying line through the both ends of the voltage applying line, electrical load of the voltage applying line is reduced to a half. Therefore, the amount of the voltage drop becomes a half of the original Therefore, when the power is provided to the voltage applying line through the both ends of the voltage applying line, the voltage applying line should satisfy a condition expressed in a following Expression 12.

$$\frac{\Delta V(\max)}{n} < A \frac{\frac{\Delta V data}{GS}}{0.5\,n}\,[\text{Volt}],\qquad \text{Expression 12}$$

wherein ΔVmax denotes a maximum voltage drop, 'n' is a number of pixels those are electrically connected to the voltage applying line, 'A' is a correction coefficient that is in a range from about 1 to about 2, ΔVdata denotes a voltage difference between the gray scales, and GS denotes a number of gray scale. When Expression 12 is expressed by expression 8, the correction coefficient A is in a range from about 1 to about 4.

ΔVmax/n is substantially proportional to Lv/P(white). Therefore a condition of Lv/P(white) is expressed as a following Expression 13.

$$\frac{Lv}{P(\text{White})} < \frac{\left(A \times \frac{\frac{\Delta V data}{GS}}{0.5n}\right) - 0.00001}{2300},\qquad \text{Expression 13}$$

wherein Lv is a electrical resistance of the voltage applying line between the pixels, P(White) is a electrical resistance of the organic light-emitting device emitting white light, 'A' is a correction coefficient that is in a range from about 1 to about 4, ΔVdata is a voltage difference between the gray scales, GS is a number of gray scale, and 'n' is a number of pixels that are electrically connected to the voltage applying line. When Expression 13 is expressed by Expression 10, the correction coefficient A is in a range from about 1 to about 4.

When Expression 13 of the video graphic array (VGA) organic light-emitting panel is calculated, Expression 13 is expressed as the following Expression 14.

$$\frac{Lv}{P(\text{White})} < (137{,}000A).\qquad \text{Expression 14}$$

When a thickness of the first layer comprising the aluminum-Neodymium (AlNd) is reduced to about 6,000 Å, the voltage drop approaches to 0.08V. A specific resistance of the aluminum-Neodymium (AlNd) is about $4.5 \times 10^{-6}$ [Ω.cm].

According to the second embodiment of the present invention, the power is applied to the voltage applying line through the both ends of the voltage applying line. Therefore, as the amount of voltage drop is reduced, the cross talk decreases.

The voltage drop of the general organic light-emitting apparatus and the organic light-emitting apparatus according to the present invention is summarized in Table 2, in case that all pixels corresponds to white color.

TABLE 2

|  | Δ Vmax |
|---|---|
| Interval of the gray scale in case of 64 gray scale gray scale | 0.078 [Volts] |
| Voltage applying line | |
| Mow 3,000[Å] | 0.54 [Volts] |
| AlNd 3,000[Å]/Mow 500[Å] | 0.22 [Volts] |
| AlNd 6,000[Å]/Mow 500[Å] | 0.12 [Volts] |
| AlNd 3,000[Å]/Mow 500[Å] Both ends connected case | ~0.08 [Volts] |

As shown in Table 2, when the voltage drop is less than 0.078V, the cross-talk is eliminated.

In the general organic light-emitting panel having a molybdenum-tungsten (MoW) voltage applying line of which thickness is 3,000 Å, the amount of the voltage drop is 0.54V, so that the display quality is deteriorated due to the cross talk.

When the voltage applying line includes the aluminum-neodymium (AlNd) layer (or the first layer) of which thickness is 3,000 Å and the molybdenum-tungsten (MoW) layer (or the second layer) of which thickness is 500 Å, the amount of the voltage drop is only 0.22V, even when all pixels correspond to a white color (see FIG. 9).

When the voltage applying line includes the aluminum-neodymium (AlNd) layer (or the first layer) of which thickness is 6,000 Å and the molybdenum-tungsten (MoW) layer (or the second layer) of which thickness is 500 Å, the amount of the voltage drop is only 0.12V, even when all pixels correspond to a white color (see FIG. 10).

When the voltage applying line includes the aluminum-neodymium (AlNd) layer (or the first layer) of which thickness is 6,000 Å and the molybdenum-tungsten (MoW) layer (or the second layer) of which thickness is 500 Å, and the power is applied to the voltage applying line through both ends of the voltage applying line, the amount of the voltage drop is only 0.08V, even when all pixels correspond to a white color.

Referring to FIGS. 3 and 11, the organic light-emitting panel includes a plurality of pixels defined by a data line, a scan line and a voltage applying line. The pixel includes a switching transistor QS, a driver transistor QD, an organic light emitting device QLED and a storage capacitor CST.

However, the condition of reducing the cross talk may be applied to other organic light-emitting apparatus having a different structure.

For example, the pixel may include a second switching transistor and a signal line. The second transistor is electrically connected to a node on which the switching capacitor and the storage capacitor is electrically connected. The signal line provides the gate of the second switching transistor with a signal.

Further, the condition of reducing cross talk may be applied to the inorganic light-emitting panel.

While the exemplary embodiments of the present invention and its advantages have been described in detail, it should be understood that various changes, substitutions and alterations can be made herein without departing from the spirit and scope of the invention as defined by appended claims.

What is claimed is:

1. A light-emitting panel comprising:
 a data line transferring a data signal;
 a scan line transferring a scan signal;
 a voltage applying line applying potential difference, the voltage applying line having first and second ends, the first end being electrically connected to an external power supply;

a switching device having a first electrode, a second electrode and a third electrode, the first electrode being electrically connected to the data line, the second electrode being electrically connected to the scan line, the third electrode outputting the data signal;

a light-emitting device having a fourth electrode and a fifth electrode, the fourth electrode being electrically connected to a reference voltage, an amount of a light generated from the light-emitting device having a relation to an amount of a density of a current applied to the light-emitting device; and a driving device having a sixth electrode, a seventh electrode and an eighth electrode, the sixth electrode being electrically connected to the fifth electrode, the seventh electrode being electrically connected to the voltage applying line, the eight electrode being electrically connected to the third electrode to receive the data signal, wherein the voltage applying line satisfies a following condition $$\frac{\Delta V(max)}{n} < A \frac{\frac{\Delta V data}{GS}}{n} \text{[Volt]},$$

wherein $\Delta V max$ is a maximum voltage drop, 'n' is a number of pixels that are electrically connected to the voltage applying line, 'A' is a correction coefficient that is in range from about 1 to about 4, $\Delta V data$ is a voltage difference between the gray scales, and GS is a number of gray scale.

2. The light-emitting panel of claim 1, wherein the voltage applying line is in parallel to the data line.

3. The light-emitting panel of claim 1, wherein the voltage applying line is in parallel to the scan line.

4. The light emitting panel of claim 1, wherein the correction coefficient 'A' is in a range from about 1 to about 2.

5. The light-emitting panel of claim 1, wherein the voltage applying line comprises a first layer and a second layer, the first layer comprising an aluminum-neodymium (AlNd), a thickness of the first layer being in a range from about 3,000 Å to about 6,000 Å, the second layer comprising a molybdenum-tungsten (MoW), a thickness of the second layer is about 500 Å.

6. The light-emitting panel of claim 1, wherein the second end of the voltage applying line is also electrically connected to the external power.

7. The light-emitting panel of claim 6, wherein the correction coefficient 'A' is in a range from about 2 to about 4.

8. A light-emitting panel comprising:

a data line transferring a data signal;

a scan line transferring a scan signal;

a voltage applying line applying potential difference, the voltage applying line having first and second ends, the first end being electrically connected to an external power supply;

a switching device having a first electrode, a second electrode and a third electrode, the first electrode being electrically connected to the data line, the second electrode being electrically connected to the scan line, the third electrode outputting the data signal;

a light-emitting device having a fourth electrode and a fifth electrode, the fourth electrode being electrically connected to a reference voltage, wherein an amount of a light generated from the light-emitting device relates to an amount of a density of a current applied to the light-emitting device; and a driving device having a sixth electrode, a seventh electrode and an eighth electrode, the sixth electrode being electrically connected to the fifth electrode, the seventh electrode being electrically connected to the voltage applying line, the eighth electrode being electrically connected to the third electrode to receive the data signal, wherein the voltage applying line satisfies a following condition $$\frac{Lv}{P(White)} < \frac{\left(A\frac{\frac{\Delta V data}{GS}}{0.5\,n}\right) - 0.00001}{2300},$$

wherein Lv is a electrical resistance of the voltage applying line between the pixels, P(White) is a electrical resistance of the light-emitting device emitting white light, 'A' is a correction coefficient that is in a range from about 1 to about 4, $\Delta V data$ is a voltage difference between the gray scales, GS is a number of gray scale, and 'n' is a number of pixels that are electrically connected to the voltage applying line.

9. The light-emitting panel of claim 8, wherein the voltage applying line is in parallel to the data line.

10. The light emitting panel of claim 8, wherein the voltage applying line is in parallel to the scan line.

11. The light emitting panel of claim 8, wherein the correction coefficient 'A' is in a range from about 1 to about 2.

12. The light-emitting panel of claim 8, wherein the voltage applying line comprises a first layer and a second layer, the first layer comprising an aluminum-neodymium (AlNd), a thickness of the first layer being in a range from about 3,000 Å to about 6,000 Å, the second layer comprising a molybdenum-tungsten (MoW), a thickness of the second layer is about 500 Å.

13. The light-emitting panel of claim 8, wherein the second end of the voltage applying line is also electrically connected to the external power.

14. The light-emitting panel of claim 13, wherein the correction coefficient 'A' is in a range from about 2 to about 4.

15. A light-emitting apparatus comprising:

a timing control part receiving an image signal and a control signal of the image signal to produce first and second timing signals and a power control signal;

a column driving part receiving the image signal and the first timing sign to output a data signal;

a row driving part receiving the second timing signal to output a scan signal;

a power supplying part receiving the power control signal to apply a voltage in accordance with the power control signal;

a data line transferring a data signal; and a light-emitting panel including i) a data line transferring a data signal, ii) a scan line transferring a scan signal, iii) a voltage applying line applying potential difference, the voltage applying line having first and second ends, the first end being electrically connected to an external power supply, iv) a switching device having a first electrode, a second electrode and a third electrode, the first electrode being electrically connected to the data line, the second electrode being electrically connected to the scan line, the third electrode outputting the data signal, v) a light emitting device having a fourth electrode and a fifth electrode, the fourth electrode being electrically connected to a reference voltage, an amount of a light generated from the light-emitting device having a relation to an amount of a density of a current applied to the light-emitting device, vi) a driving device having a sixth electrode, a seventh electrode and an eighth electrode, the sixth electrode being electrically connected to the fifth electrode, the seventh electrode being electrically connected to the voltage applying line, the eighth electrode being electrically connected to the third electrode to receive the data signal, wherein the voltage applying line satisfies a following condition $$\frac{\Delta V \text{ (max)}}{n} < A \frac{\frac{\Delta V data}{GS}}{n} [\text{Volt}],$$

wherein ΔVmax is a maximum voltage drop, 'n' is a number of pixels those are electrically connected to the voltage applying line, 'A' is a correction coefficient that is in a range from about 1 to about 4, ΔVdata is a voltage difference between the gray scales, and GS is a number of gray scale.

16. The light-emitting apparatus of claim 15, wherein the voltage applying line is in parallel to the data line.

17. The light-emitting apparatus of claim 15, wherein the voltage applying line is in parallel to the scan line.

18. The light-emitting apparatus of claim 15, wherein the correction coefficient 'A' is in a range from about 1 to about 2.

19. The light-emitting apparatus of claim 15, wherein the voltage applying line comprises a first layer and a second layer, the first layer comprising an aluminum-neodymium (AlNd), a thickness of the first layer being in a range from about 3000 Å to about 6,000 Å, the second layer comprising a molybdenum-tungsten (MoW), a thickness a of the second layer being about 500 Å.

20. The light-emitting panel of claim 15, wherein the second end of the voltage applying line is also electrically connected to the external power.

21. The light-emitting apparatus of claim 20, wherein the correction coefficient 'A' is in a range from about 2 to about 4.

22. A light-emitting apparatus comprising:
a timing control part receiving an image signal and a control signal of the image signal to output first and second timing signals and a power control signal;
a column driving part receiving the image signal and the first timing signal to output a data signal;
a row driving part receiving the second timing signal to output a scan signal;
a power supplying part receiving the power control signal to apply a voltage in accordance with the power control signal;
a data line transferring a data signal; and
a light-emitting panel including, i) a data line transferring a data signal, ii) a scan line transferring a scan signal, iii) a voltage applying line applying potential difference, iv) a switching device having a first electrode, a second electrode and a third electrode, the first electrode being electrically connected to the data line, the second electrode being electrically connected to the scan line, the third electrode outputting the data signal, v) a light-emitting device having a fourth electrode and a fifth electrode, the fourth electrode being electrically connected to a reference voltage, an amount of a light generated from the light-emitting device having a relation to an amount of a density of a current applied to the light-emitting device, vi) a driving device having a sixth electrode, a seventh electrode and an eighth electrode, the sixth electrode being electrically connected to the fifth electrode, the seventh electrode being electrically connected to the voltage applying line, the eighth electrode being electrically connected to the third electrode to receive the data signal, wherein the voltage applying line satisfies a following condition $$\frac{Lv}{P(\text{White})} < \frac{\left(A \frac{\frac{\Delta V data}{GS}}{0.5 \, n}\right) - 0.00001}{2300},$$

wherein Lv is a electrical resistance of the voltage applying line between the pixels, P(White) is a electrical resistance of the light-emitting device emitting white light, 'A' is a correction coefficient that is in a range from about 1 to about 4, ΔVdata is a voltage difference between the gray scales, GS is a number of gray scale, and 'n' is a number of pixels those are electrically connected to the voltage applying line.

23. The light-emitting apparatus of claim 22, wherein the voltage applying line is in parallel to the data line.

24. The light-emitting apparatus of claim 22, wherein the voltage applying line is in parallel to the scan line.

25. The light-emitting apparatus of claim 22, wherein the correction coefficient 'A' is in a range from about 1 to about 2.

26. The light-emitting apparatus of claim 22, wherein the voltage applying line comprises a first layer and a second layer, the first layer comprising an aluminum-neodymium (AlNd), a thickness of the first layer being in a range from about 3,000 Å to about 6,000 Å, the second layer comprising a molybdenum-tungsten (MoW), a thickness of the second layer being about 500 Å.

27. The light-emitting panel of claim 22, wherein the second end of the voltage applying line is also electrically connected to the external power.

28. The light-emitting apparatus of claim 27, wherein the correction coefficient 'A' is in a range from about 2 to about 4.

29. An organic light-emitting apparatus, comprising:
a timing control part receiving an image signal and a control signal of the image signal to output first and second timing signals and a power control signal;
a column driving part receiving the image signal and the first timing signal to output a data signal;
a row driving part receiving the second timing signal to output a scan signal;
a power supplying part receiving the power control signal to apply a voltage in accordance with the power control signal;
a data line transferring a data signal; and
an organic light-emitting panel including, i) a data line transferring a data signal, ii) a scan line transferring a scan signal, iii) a voltage applying line applying potential difference, the voltage applying line having first and second ends, the first and second ends being electrically connected to the power supplying part, iv) a switching device having a first electrode, a second electrode and a third electrode, the first electrode being electrically connected the data line, the second electrode being electrically connected to the scan line, the third electrode outputting the data signal, v) an organic light emitting device having a fourth electrode and a fifth electrode, the fourth electrode being electrically connected to a reference voltage, an amount of a light generated from the organic light-emitting device having a relation to an amount of a density of a current applied to the organic light-emitting device, vi) a driving device having a sixth electrode, a seventh electrode and an eighth electrode, the sixth electrode being electrically connected to the fifth electrode, the seventh electrode being electrically connected to the voltage applying line, the eighth electrode being electrically connected to the third electrode to receive the data signal, wherein the voltage applying line comprises a first layer and a second layer, the first layer comprising an aluminum-neodymium (AlNd), a thickness of the first layer being in a range from about 3,000 Å to about 6,000 Å, the second layer comprising a molybdenum-tungsten (MoW), a thickness of the second layer being about 500 Å.

* * * * *